(12) United States Patent
Sharma

(10) Patent No.: US 11,122,205 B1
(45) Date of Patent: Sep. 14, 2021

(54) CAMERA ACTUATOR ASSEMBLY WITH SENSOR SHIFT FLEXURE ARRANGEMENT

(71) Applicant: Apple Inc., Cupertino, CA (US)

(72) Inventor: Shashank Sharma, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 84 days.

(21) Appl. No.: 16/563,745

(22) Filed: Sep. 6, 2019

Related U.S. Application Data

(60) Provisional application No. 62/731,715, filed on Sep. 14, 2018.

(51) Int. Cl.
*H04N 5/232* (2006.01)
*H04N 5/225* (2006.01)
(Continued)

(52) U.S. Cl.
CPC ....... *H04N 5/23287* (2013.01); *G02B 27/646* (2013.01); *G03B 3/10* (2013.01);
(Continued)

(58) Field of Classification Search
CPC ........... H04N 5/23287; H04N 5/23258; H04N 5/2253; H04N 5/2254; H04N 5/2257; H04N 5/23261; H04N 5/23212; H04N 5/23293; H04N 5/23248; H04N 5/23264; H04N 5/2328; G03B 3/10; G03B 2205/0069; G03B 5/00; G03B 2205/0007; G03B 2205/0015; G03B 5/02; G03B 13/36; G03B 2205/00; G03B 2205/0023; G03B 2205/0038; G03B 2205/0053; G03B 2205/0061; G03B 2205/0076; G03B 2205/0084; G02B 27/646; G02B 7/08;
(Continued)

(56) References Cited

U.S. PATENT DOCUMENTS 7,612,953 B2    11/2009  Nagai et al.
7,952,612 B2 *   5/2011  Kakkori ............. H04N 5/23248
                                                    348/208.6
(Continued)

FOREIGN PATENT DOCUMENTS

CN    101808191    8/2010
CN    102749697    10/2012
(Continued)

OTHER PUBLICATIONS

U.S. Appl. No. 16/083,819, filed Sep. 10, 2018, Aurelien R. Hubert.
(Continued)

*Primary Examiner* — Twyler L Haskins
*Assistant Examiner* — Akshay Trehan
(74) *Attorney, Agent, or Firm* — Robert C. Kowert; Kowert, Hood, Munyon, Rankin & Goetzel, P.C.

(57) ABSTRACT

Various embodiments include a camera with image sensor shifting capabilities and a flexure arrangement. In various embodiments, the flexure arrangement may include an upper flexure and a lower flexure. The upper flexure may include a suspension wire that extends between two sheets. The lower flexure may include one or more flexure arms that connect a moveable platform to a stationary platform.

20 Claims, 8 Drawing Sheets

(51) Int. Cl.
*G02B 27/64* (2006.01)
*H02K 41/035* (2006.01)
*H02P 25/034* (2016.01)
*G03B 3/10* (2021.01)
*H05K 1/11* (2006.01)
*H05K 1/18* (2006.01)

(52) U.S. Cl.
CPC ....... *H02K 41/0354* (2013.01); *H02P 25/034* (2016.02); *H04N 5/2253* (2013.01); *H04N 5/2254* (2013.01); *H04N 5/2257* (2013.01); *H04N 5/23258* (2013.01); *G03B 2205/0007* (2013.01); *G03B 2205/0015* (2013.01); *G03B 2205/0053* (2013.01); *G03B 2205/0069* (2013.01); *H02K 2201/18* (2013.01); *H05K 1/118* (2013.01); *H05K 1/189* (2013.01)

(58) Field of Classification Search
CPC ...... G02B 7/09; G02B 27/64; H02K 41/0354; H02K 2201/18; H02K 41/0356; H02P 25/034; H05K 1/165; H05K 2201/10121; H05K 2201/10151; H05K 1/118; H05K 1/189
USPC ..... 348/208.7, 208.11; 359/557; 396/13, 55; 310/12.16
See application file for complete search history.

(56) References Cited

U.S. PATENT DOCUMENTS

| | | | |
|---|---|---|---|
| 8,248,497 B2 * | 8/2012 | Tanimura | H04N 5/23248 348/294 |
| 8,264,549 B2 | 9/2012 | Towika et al. | |
| 8,548,313 B2 | 10/2013 | Krueger | |
| 8,749,643 B2 * | 6/2014 | Lim | G03B 17/02 348/208.11 |
| 8,866,918 B2 * | 10/2014 | Gregory | G03B 3/02 348/208.2 |
| 8,908,086 B2 | 12/2014 | Kawai | |
| 8,947,544 B2 | 2/2015 | Kawai | |
| 8,998,514 B2 | 4/2015 | Gutierrez et al. | |
| 9,736,345 B1 | 8/2017 | Topliss et al. | |
| 10,257,433 B2 | 4/2019 | Eromaki | |
| 2001/0001588 A1 | 5/2001 | Matz | |
| 2003/0184878 A1 | 10/2003 | Tsuzuki | |
| 2006/0017815 A1 | 1/2006 | Stavely et al. | |
| 2007/0279497 A1 * | 12/2007 | Wada | H04N 5/2257 348/208.7 |
| 2009/0295986 A1 * | 12/2009 | Topliss | G02B 7/026 348/374 |
| 2012/0106936 A1 * | 5/2012 | Lim | G03B 5/02 396/55 |
| 2012/0120512 A1 | 5/2012 | Wade et al. | |
| 2012/0268642 A1 | 10/2012 | Kawai | |
| 2013/0107068 A1 * | 5/2013 | Kim | G02B 27/646 348/208.11 |
| 2013/0119785 A1 | 5/2013 | Han | |
| 2015/0051097 A1 | 2/2015 | Anderton et al. | |
| 2015/0135703 A1 * | 5/2015 | Eddington | H04N 5/23287 60/528 |
| 2015/0358528 A1 | 12/2015 | Brodie et al. | |
| 2016/0041363 A1 | 2/2016 | Hagiwara | |
| 2016/0070115 A1 * | 3/2016 | Miller | G02B 27/646 359/557 |
| 2016/0073028 A1 * | 3/2016 | Gleason | G02B 7/08 348/208.2 |
| 2016/0097937 A1 | 7/2016 | Lam | |
| 2016/0360111 A1 * | 12/2016 | Thivent | H04N 5/23287 |
| 2017/0155816 A1 * | 6/2017 | Ito | H04N 5/2328 |
| 2017/0324906 A1 * | 11/2017 | Kang | G03B 3/10 |
| 2017/0351158 A1 | 12/2017 | Kudo | |
| 2018/0041668 A1 * | 2/2018 | Cui | G03B 3/00 |
| 2018/0048793 A1 | 2/2018 | Gross et al. | |

FOREIGN PATENT DOCUMENTS

| | | |
|---|---|---|
| CN | 10502204 | 11/2015 |
| CN | 105025657 | 11/2015 |
| CN | 105573014 | 5/2016 |
| CN | 106291862 | 1/2017 |
| JP | 2011203476 | 10/2011 |
| JP | 2015146040 | 8/2015 |
| KR | 20100048361 | 5/2010 |
| KR | 20150051097 | 5/2015 |
| TW | 201114249 | 4/2011 |
| TW | 201418863 | 5/2014 |

OTHER PUBLICATIONS

U.S. Appl. No. 15/940,661, filed Mar. 29, 2018, Shashank Sharma.
U.S. Appl. No. 16/036,838, filed Jul. 16, 2018, Shashank Sharma.

* cited by examiner

CAMERA ACTUATOR ASSEMBLY WITH SENSOR SHIFT FLEXURE ARRANGEMENT

This application claims benefit of priority to U.S. Provisional Application No. 62/731,715, filed Sep. 14, 2018, titled "Camera Sensor Shift Flexure Arrangement", which is hereby incorporated by reference in its entirety.

BACKGROUND

Technical Field

This disclosure relates generally to architecture for a camera with image sensor shifting capabilities and a flexure arrangement.

Description of the Related Art

The advent of small, mobile multipurpose devices such as smartphones and tablet or pad devices has resulted in a need for high-resolution, small form factor cameras for integration in the devices. Some small form factor cameras may incorporate optical image stabilization (OIS) mechanisms that may sense and react to external excitation/disturbance by adjusting location of the optical lens on the X and/or Y axis in an attempt to compensate for unwanted motion of the lens. Some small form factor cameras may incorporate an autofocus (AF) mechanism whereby the object focal distance can be adjusted to focus an object plane in front of the camera at an image plane to be captured by the image sensor. In some such autofocus mechanisms, the optical lens is moved as a single rigid body along the optical axis of the camera (e.g. the Z-axis) to refocus the camera.

BRIEF DESCRIPTION OF THE DRAWINGS

FIG. 3 shows an example lower flexure of a flexure arrangement of the camera, in accordance with some embodiments.

Figure 1:
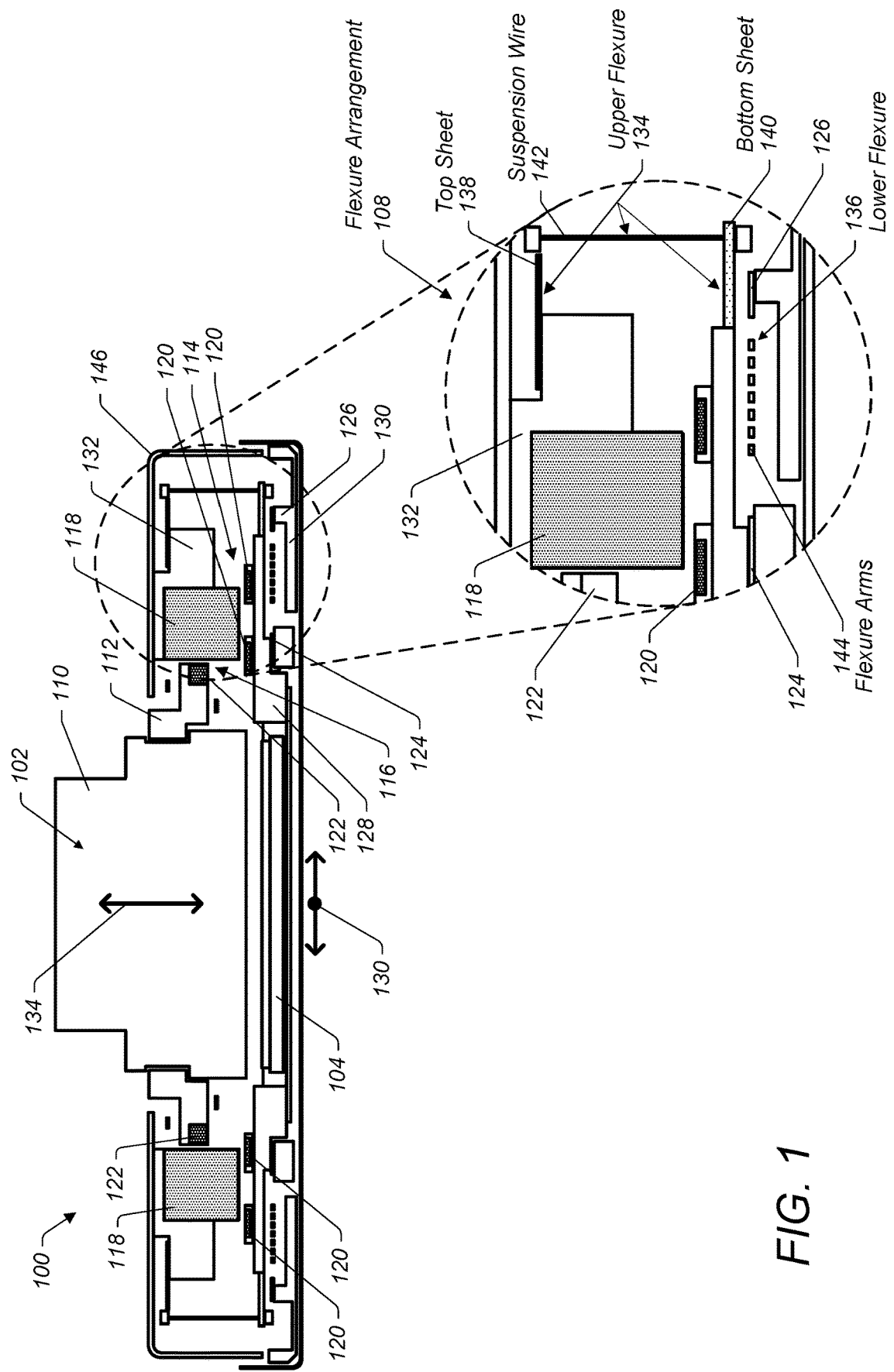
FIG. 1 illustrates a cross-sectional view of an example camera that may have image sensor shifting capabilities and that may include a flexure arrangement allowing for motion of the image sensor in the X and/or Y directions, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Upper," "Lower," etc. As used herein, these terms are used as labels for nouns that they precede, and do not imply any type of ordering (e.g., spatial, temporal, logical, etc.). For example, a flexure arrangement may be described herein as comprising an upper flexure and a lower flexure. The terms "upper" and "lower" do not necessarily imply that the upper flexure must be above the lower flexure.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Some embodiments include camera equipment outfitted with controls, magnets, and voice coil motors to improve the effectiveness of a miniature actuation mechanism for a compact camera module. More specifically, in some embodiments, compact camera modules include actuators to deliver functions such as autofocus (AF) and/or optical image stabilization (OIS). One approach to delivering a very compact actuator for AF and/or OIS is to use a voice coil motor (VCM) actuator. In various embodiments, AF movement may comprise movement of a lens along an optical axis, e.g., along the Z-axis. Furthermore, OIS movement may comprise lateral movement of the image sensor relative to the optical axis, e.g., along the X-Y plane. As used herein, the optical axis may be the path of light as it passes through one or more lenses and impinges on the image sensor.

In some embodiments, a camera may include one or more lens elements, an image sensor, a moveable platform, a stationary platform (the platforms are sometimes referred to as a first platform and a second platform, herein), an actuator module, and a flexure arrangement. A lens holder may include the one or more lens elements and the one or more lens elements may define an optical axis for the camera. The image sensor may be configured to capture light that has passed through the one or more lens elements of the lens holder. The moveable platform may be coupled (e.g., fixedly coupled) to the image sensor such that the image sensor moves together with the moveable platform. The stationary platform may be configured to be stationary (relative to the base, for example). The actuator module may be configured to move the image sensor in one or more directions orthogonal to the optical axis, e.g., to provide OIS movement of the image sensor.

In embodiments disclosed herein, within the camera there is one or more set of components that are considered to be fixed such that when the OIS actuator is being operated, the OIS actuator causes movement of the image sensor relative to those fixed components. For instance, the image sensor and its substrate attached to the moveable platform may be allowed to move with respect to other components of the camera by a flexure arrangement that flexibly attaches the moveable platform to various stationary components of the camera (e.g., a magnet holder, can, etc.). In at least some embodiments, the term "stationary" is a relative term. For instance, some components of the camera are stationary with respect to the moveable platform.

In some designs with only a single or lower flexure, depending upon the weight of the assembly, a more supportive flexure may be required. For example, an individual flexure may be stiffened to support an assembly with a greater weight, or to prevent breakage (e.g., when the camera is dropped). However, stiffening of an individual flexure, in some designs, may impede the desired OIS movement in the X/Y directions in order to obtain the additional stiffness in the Z direction. Also, stiffening of an individual flexure may result in an unwanted increase in height of the flexure (where the height of the flexure corresponds to the Z direction in the camera). This may impact the height of the overall camera assembly.

Embodiments with an upper and lower flexure, as described herein, may obtain a desired increase in stiffness and/or strength in the Z direction, while maintaining movement in the X and Y directions for OIS, without impacting the height of the camera assembly.

In some examples, the flexure arrangement may be configured to guide motion of the moveable platform in a controlled manner. The flexure arrangement may include an upper flexure and a lower flexure. The upper flexure may include a top sheet, a bottom sheet, and a set of suspension wires. The top sheet may be coupled to a fixed structure of the camera in some cases. For instance, the actuator may include a voice coil motor (VCM) actuator that includes one or more magnets and one or more coils, and the top sheet may be attached to a magnet holder that holds the magnets. The bottom sheet may be coupled to a structure that is moveable relative to the fixed structure. For instance, the bottom sheet may be coupled to the moveable platform that includes the image sensor. The suspension wires may extend from the top sheet to the bottom sheet. For instance, the suspension wires may have a top end portion that is attached to the top sheet, and a bottom end portion that is attached to the bottom sheet. In some embodiments, the top sheet may define a first plane that is parallel to the image sensor. Additionally, or alternatively, the bottom sheet may define a second plane that is parallel to the first plane and/or the image sensor. In some instances, the suspension wires may extend from the top sheet to the bottom sheet in a direction that is orthogonal to the image sensor. In some embodiments, the top end portion of the suspension wires may be attached to a corner portion of the top sheet, and the bottom end portion of the suspension wires may be attached to a corresponding corner portion of the bottom sheet that is proximate the corner portion of the top sheet.

In some embodiments, the lower flexure may include one or more flexure arms that connect the moveable platform to the stationary platform.

In some embodiments, a flexure arrangement comprising an upper flexure that includes a top sheet and suspension wires connected to a bottom sheet and a lower flexure comprising flexure arms that provide a path to connect electrical traces from an image sensor to a stationary component of the camera may provide more stiffness in the Z-direction than a single flexure sheet. For example, suspension wires may be relatively stiff in the Z-direction but allow movement in the X and Y directions. Also, using separate flexures (e.g. an upper flexure comprising a top sheet, suspension wires, and bottom sheet, and a lower flexure comprising flexure arms) may decouple the stiffness requirements needed to support a moveable platform in different directions. For example the majority of the stiffness required to support the platform in the Z-direction may be provided by the upper flexure comprising a top sheet, suspension wires, and bottom sheet, such that a thickness of a lower flexure comprising flexure arms does not need to support the weight of the platform in the Z-direction. Thus Z-stiffness and X-stiffness and Y-stiffness may be provided by different ones of the flexures. In some embodiments, X-stiffness and Y-stiffness for a moveable platform relative to a stationary platform may be achieved by an X-stiffness and Y-stiffness of suspension wires and additionally by an X-stiffness and Y-stiffness of a lower flexure comprising flexure arms that connect wire traces from the image sensor to components connected to the stationary platform.

In some examples, a VCM actuator assembly may include an OIS VCM actuator to move the image sensor in directions orthogonal to the optical axis. For instance, the OIS VCM actuator may include a magnet attached to the magnet holder, and an OIS coil coupled to the moveable platform. In some embodiments, the VCM actuator assembly may include an AF VCM actuator to move the lens along the optical axis. The AF VCM actuator may include the magnet attached to the magnet holder, and an AF coil coupled to a lens carrier that holds the one or more lens elements. In some embodiments, the same magnet or set of magnets may be used to form both the OIS VCM actuator(s) and the AF VCM actuator(s). According to some examples, the top sheet of the upper flexure may include a first portion that is attached to the magnet holder, and a second portion that is attached to the lens carrier. The second portion of the top sheet may suspend the lens carrier from the magnet holder. For example, the second portion of the top sheet may act as a leaf spring that allows the lens carrier to move up and down vertically in the Z-direction relative to the magnet holder.

In some embodiments, the camera may be part of a device (e.g., a mobile device, a mobile multifunction device, etc.). In some cases, the device may include a display and one or more processors. The processor(s) may be configured to cause the camera to capture an image via the image sensor. Furthermore, the processor(s) may be configured to cause the display to present the image. In some embodiments, the processor(s) may be configured to cause one or more of the VCM actuators to move the image sensor in one or more directions orthogonal to the optical axis. In some embodiments, the processor(s) may be configured to cause one or more of the VCM actuators to move the lens carrier in a direction along the optical axis (e.g. the Z-direction), such that the lens carrier moves closer to or farther away from the image sensor in the Z-direction.

In some embodiments, a VCM actuator (or a VCM actuator assembly) may include one or more magnets, one or more coils, the moveable platform, a magnet holder (which may be stationary), and the flexure arrangement.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

Figure 2:
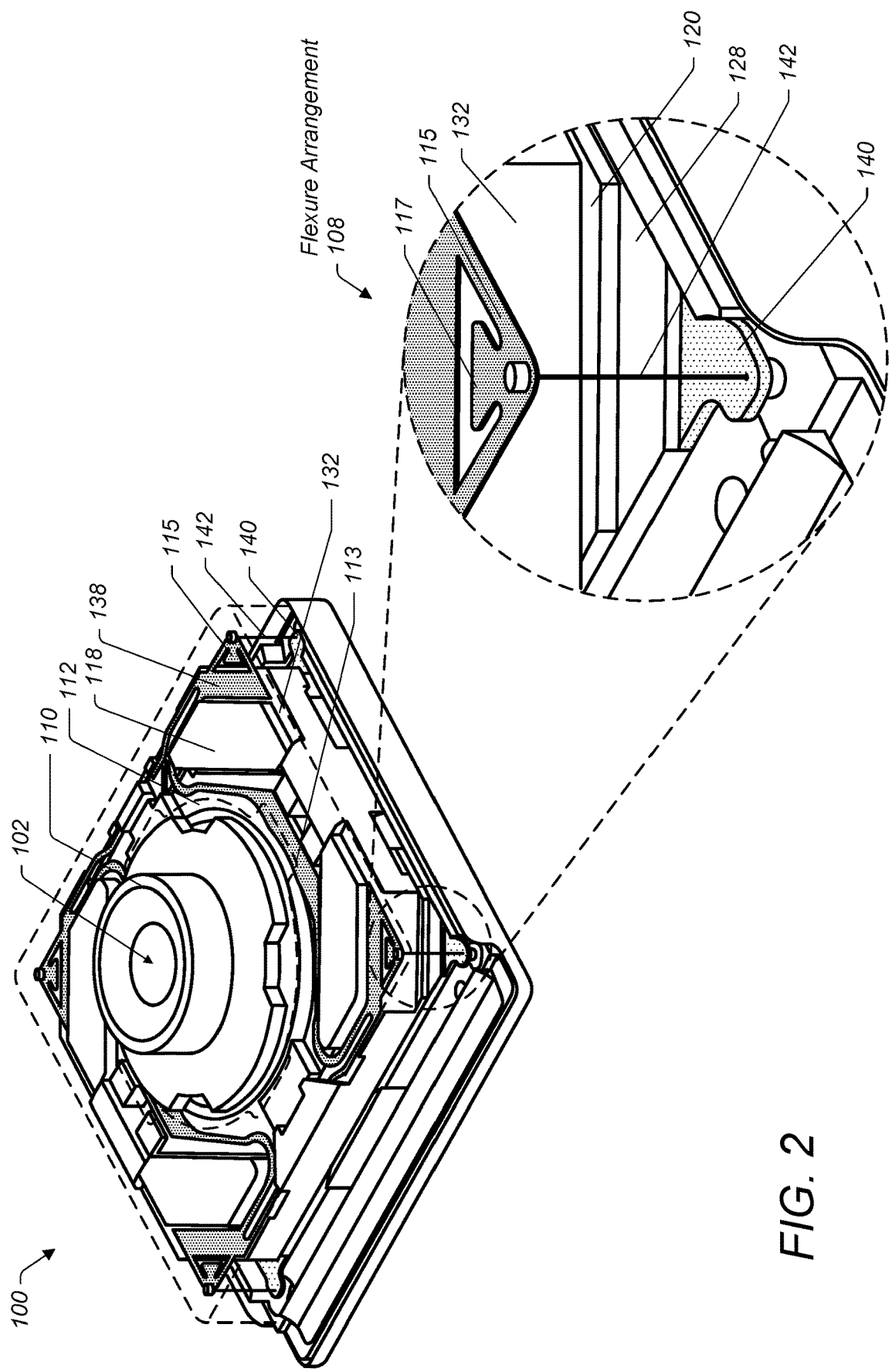
FIG. 2 illustrates a perspective view of the example camera and the flexure arrangement of FIG. 1, in accordance with some embodiments.

FIG. 1 illustrates a cross-sectional view of an example camera 100 that may have image sensor shifting capabilities and that may include a flexure arrangement, in accordance with some embodiments. FIG. 2 illustrates a perspective view of the camera 100 and the flexure arrangement of FIG. 1, in accordance with some embodiments. In some embodiments, the camera 100 may include one or multiple features, components, and/or functionality of embodiments described herein with reference to FIGS. 3-8.

According to various embodiments, the camera 100 may include a set of one or more lenses 102, an image sensor 104, a flexure arrangement 108, and one or more actuators. The one or more lenses 102 may include one or more lens elements that define an optical axis (for example, the one or more lenses may include multiple lens elements, each lens element of a transparent material). The one or more lenses 102 (whether or not the lenses includes a single lens element or multiple lens elements) may be held within a lens barrel 110, which may in turn be connected to a lens carrier 112, although it should be appreciated that the lens barrel 110 and lens carrier 112 may be a common component in some embodiments. In at least the illustrated embodiment, lens barrel 110 holds one or more lenses 102 in place and acts as a support structure for the one or more lenses 102. In some embodiments, the lens carrier 112 provides a support structure for connections to other components, such as connections to flexures or connections to other components via flexures. For example, in some embodiments a second portion of a top sheet 138 may include leaf springs that connect lens carrier 112 to magnet holder 132 such that the lens carrier 112 may move in the Z-direction relative to the magnet holder 132. In at least one example, the lens barrel 110 and lens carrier 112 may be coupled together (e.g., via threads or otherwise) to form a single component, or may be formed of a single common component that performs the functionality of both the lens barrel and the lens carrier, in some examples. The image sensor 104 may be configured to capture light passing through the one or more lenses 102 and may convert the captured light into image signals. The path of light through the one or more lenses and as the light impinges on the image sensor 104 may be referred to as the optical axis in some examples.

In some embodiments, an actuator assembly may include an optical image stabilization (OIS) actuator(s) and/or an autofocus (AF) actuator. The actuator assembly may include a first actuator (e.g., an OIS voice coil motor (VCM) actuator 114) to perform optical image stabilization. The actuator module may also include a second actuator (e.g., an AF VCM actuator 116) which may be used to perform autofocus, in some embodiments.

In some examples, the OIS VCM actuator 114 may include one or more magnets 118 and one or more OIS coils 120. Furthermore, the AF VCM actuator 116 may include one or more magnets 118 and one or more AF coils 122. In some embodiments, the magnets 118 may be shared magnets that are used for both the OIS VCM actuator 114 and the OIS VCM actuator 116, e.g., as indicated in FIG. 1. For example, multiple coils of either or both of the AF actuator and the OIS actuator may magnetically interact with a same magnet to cause the lens carrier 112 to move vertically in the Z-direction and to cause the moveable platform 124 that includes the image sensor 104 to move in the X-direction and/or Y-direction. However, in other embodiments, each of the OIS VCM actuator 114 and the AF VCM actuator 116 may have a respective set of one or more magnets that are not shared by the actuators. In some embodiments, the OIS coils and AF coils may be constructed from the same type of material and may be constructed similarly. Generally, an OIS coil is a coil that supports optical image stabilization functionality and is positioned as part of an OIS actuator and an AF coil is a coil that supports autofocus functionality and is positioned as part of an AF actuator. For example, an OIS coil of an OIS actuator may be positioned relative to a corresponding magnet to produce Lorentz forces in the X and Y directions and an AF coil of an AF actuator may be positioned relative to a corresponding magnet (which may be the same magnet as used by the OIS actuator) to produce Lorentz forces in the optical axis direction, e.g. in the Z-direction. It is contemplated that OIS coils and AF coils may be constructed from different types of materials or constructed in a different manner, in some embodiments.

In some embodiments, the camera 100 and/or the OIS VCM actuator 114 may include a moveable platform 124 and a stationary platform 126. Movement of the moveable platform may be described with respect to fixed components of the camera, such as the magnet holder 132, base 130, or stationary platform 126 mounted to base 130. For instance, an OIS VCM actuator associated with optical image stabilization functionality may be configured to facilitate movement of the moveable platform 124 orthogonal to the optical axis.

In some embodiments, a flexure arrangement, such as flexure arrangement 108, may allow the moveable platform 124 to move in directions orthogonal to the optical axis while minimizing movement of the moveable platform 124 along the optical axis. For example, a moveable platform 124 may be configured to move, responsive to the OIS VCM actuator, with respect to base 130 in directions orthogonal to the optical axis (e.g., along the X-Y plane).

Various arrangements of components (e.g., suspension wires and flexure components) may facilitate movement of the moveable platform orthogonal to the optical axis while limiting movement of the moveable platform along the Z plane. In various embodiments, the moveable platform generally moves with respect to a number of stationary features such as the magnet holder 132, top sheet 138, and stationary platform 126. In some embodiments, a common fixed structure provides support for suspension wires that facilitate movement of the moveable platform along the X-Y plane but restricts movement of the moveable platform along the Z plane.

In some embodiments, the common fixed structure (e.g., the top sheet 138 resting on magnet holder 132 that is fixedly attached to the can 146, in some embodiments) ensures that the suspension wires remain fixed with respect to one another. It is contemplated that the common fixed structure supporting the suspension wires may not remain fixed with respect to the base, in some embodiments. For instance, a structure supporting the suspension wires may itself move slightly with respect to other components of the camera. For example, the top sheet 138 may include semi-flexible tabs to which the suspension wires 142 are connected. In some situations, for example when the camera is dropped, the semi-flexible tabs of the top sheet 138 may flex to absorb forces of impact due to the camera being dropped such that the semi-flexible tabs allow the suspension wires and attached moveable platform to move slightly within a can 146 of the camera 100 and towards or away from base 130.

The moveable platform 124 may be coupled to the image sensor 104 such that the image sensor 104 moves together with the moveable platform 124. For instance, the moveable platform 124 may be attached to a substrate 128 that is coupled to the image sensor 104. The stationary platform 126 is configured to be stationary (e.g., relative to the base 130 of the camera). For instance, the stationary platform 126 may be fixedly attached to base 130 of the camera 100. In some embodiments, stationary platform 126 may be formed as part of the base of the camera 100. In some embodiments, in order to maintain the fixed relationship to the camera base, the stationary platform may be formed on or connected to some other components of the camera that remains in constant relation to the camera base 130.

The OIS VCM actuator 114 is configured to move the moveable platform 124, the substrate 128, and/or the image sensor 104 in one or more directions orthogonal to the optical axis, e.g., as indicated by arrows 130 in FIG. 1, to provide OIS movement of the image sensor 104. According to some examples, the magnets 118 may be attached to a magnet holder 132. The magnet holder 132 may be a fixed structure of the camera 100 in some embodiments. For example, the magnet holder may be fixedly coupled to or fashioned from one or more of the set of components that are considered to be fixed such that when the OIS actuator is being operated, the OIS actuator causes movement of the image sensor relative to those fixed components (e.g., fixed to the underneath surface of the shield can 146 for the camera). The OIS coils 120 may be attached to, or formed on, the substrate 128. In some embodiments, each OIS coil 114 may be located below a respective magnet 118, e.g., as shown in FIG. 1. In some instances, the magnets 118 may magnetically interact with the OIS coils 120 to produce Lorentz forces that move the OIS coils 120 (together with the substrate 128, the moveable platform 124, and/or the image sensor 104) relative to the magnets 118.

In some embodiments, the AF VCM actuator 116 may be configured to move the one or more lenses 102, the lens barrel 110, and the lens carrier 112 along the optical axis, e.g., as indicated by arrows 134 in FIG. 1, to provide AF movement of the one or more lenses 102. According to some examples, the AF coil 122 may be attached to the lens carrier 112. For instance, the AF coil 122 may be configured to circumferentially surround the lens carrier 112. The AF coil 122 may be located between the magnets 118 and the one or more lenses 102 mounted in the lens carrier 112 in some cases, e.g., as shown in FIG. 1. Other embodiments, such as a fixed coil (in place of the fixed magnet in the illustrated embodiments) and moving magnet (moving with the lens carrier) are contemplated (where the magnet is attached to the lens carrier 112 and moves with the lens carrier). In some instances, the magnets 118 may magnetically interact with the AF coil 122 to produce Lorentz forces that move the AF coil 122 (together with the lens carrier 112, the lens barrel 110, and the one or more lenses 102) relative to the magnets 118.

According to various embodiments, the camera 100, and the OIS VCM actuator 114 may include a flexure arrangement 108. In some instances, the flexure arrangement 108 may be configured to suspend or hold one or more elements of the OIS actuator, moveable platform 124, the substrate 128, and/or the image sensor 104 in a controlled manner. In various examples, the flexure arrangement 108 may include an upper flexure 134 (comprising a top sheet 138, suspension wires 142, and bottom sheet 140) and a lower flexure 136 (comprising flexure arms 144 that provide a path for electrical traces between the image sensor 104 and electronic components coupled to stationary components of the camera, such as base 130).

Although a particular embodiment with a particular arrangement of top and bottom sheets and suspension wires is illustrated, it is contemplated that other materials and components may be substituted and formed in various other arrangements for the overall flexure arrangement without necessarily departing from the scope of the disclosure.

In some embodiments, the upper flexure 134 may include a top sheet 138, a bottom sheet 140, and a suspension wire 142. The top sheet 138 and/or the bottom sheet 140 may be etched sheets in some examples.

FIG. 2 illustrates a perspective view of the example camera and the flexure arrangement of FIG. 1, in accordance with some embodiments. In the illustrated embodiment, the top sheet 138 is coupled to a fixed structure of the camera 100. For instance, the top sheet 138 is attached to the magnet holder 132. The bottom sheet 140 may be coupled to a structure that is moveable relative to the fixed structure. For instance, the bottom sheet 140 may be fixedly coupled to substrate 128 that is itself is fixedly coupled to the moveable platform 124.

In embodiments, "fixedly coupled" or "coupled in fixed relation" indicates that there is little to no relative movement between the components that are fixedly coupled. In an example, as the moveable platform 124 moves in the X and/or Y direction(s), the bottom sheet 140 also moves in the X and/or Y direction(s) because they are fixedly coupled. But, note that although there is a connection between the magnet holder 132 and the moveable platform 124 via the upper flexure, the magnet holder remains stationary as the moveable platforms moves in the X and/or Y directions. Such a relationship may be described as moveably coupled (e.g., the moveable platform is moveably coupled to the magnet holder), as used herein.

In some examples, the bottom sheet 140 may be attached to the substrate 124, e.g., as indicated in FIG. 1. The suspension wire 142 may extend from the top sheet 138 to the bottom sheet 140. For instance, the suspension wire 142 may have a top end portion that is attached to the top sheet 138, and a bottom end portion that is attached to the bottom sheet 140. In some embodiments, the top sheet 138 may define a first plane that is parallel to the image sensor 104. Additionally, or alternatively, the bottom sheet 140 may define a second plane that is parallel to the first plane and/or the image sensor 104. In some instances, the suspension wire 142 may extend from the top sheet 138 to the bottom sheet bottom sheet 140 in a direction that is orthogonal to a plane of the image sensor 104.

According to various embodiments, the top sheet 138 may also form one or more flexures for the AF VCM actuator 116. For example an inner portion of the top sheet 138 may be mechanically connected to the lens carrier 112 such that the top sheet 138 restricts motion of the lens carrier 112 in the X and Y directions, but flexes to allow motion of the lens carrier 112 in the Z-direction. In addition, a top sheet, such as top sheet 138, may include flexible corner tabs that connect to suspension wires, wherein the flexible corner tabs allow for shocks (for example due to dropping) to be absorbed in part by the top sheet 138 to reduce stresses on the suspension wires 142. For example, top sheet 138 is illustrated with a first portion 115 near the attachment point for supporting the suspension wire 142. Various shapes and arrangements of the sheet may be formed to impart functionality, such as the tab 117 illustrated proximate to first portion 115, that acts as a spring/and or damper, in the illustrated embodiment. In embodiments, a damping gel may be added to this area of the sheet to dampen vibrations (e.g., on tab 117 or between tab 117 and first portion 115).

In the illustrated example, a first portion 115 of the top sheet 138 extends beyond the supporting magnet holder 132 to form a support for suspension wire 142. An intermediate portion of the top sheet 138 is illustrated as attached to the fixed structure (e.g., attached to the magnet holder 132, although the intermediate portion may be attached to some other fixed portion of the camera, such as the can 146, for example), and a second portion 113 of the top sheet 138 may be attached to the lens carrier 112, e.g., as indicated in FIG. 2. In such examples, the second portion of the top sheet 138 that is attached to the lens carrier 112 may function to suspend the lens carrier 112, the lens barrel 110, and/or the one or more lenses 102 from the magnet holder 132 in some embodiments. While the intermediate portion of the top sheet may remain fixed to the magnet holder 132, the second portion of the top sheet 138 may be configured (e.g., may be flexible) to allow the lens carrier 112 to move along the optical axis, e.g., when the AF VCM actuator 116 is actuated to provide AF movement of the lens carrier 112.

In some embodiments, the lower flexure 136 may include one or more flexure arms 144. The flexure arms 144 may be configured to connect the moveable platform 124 to the stationary platform 126. In some embodiments, lower flexure 136 may include components of both the moveable platform 124 as well as the stationary platform 126. Embodiments of the lower flexure 136 are discussed in further detail below with reference to FIGS. 3-5. For example, FIG. 5 illustrates a top view of lower flexure 500.

Figure 3:
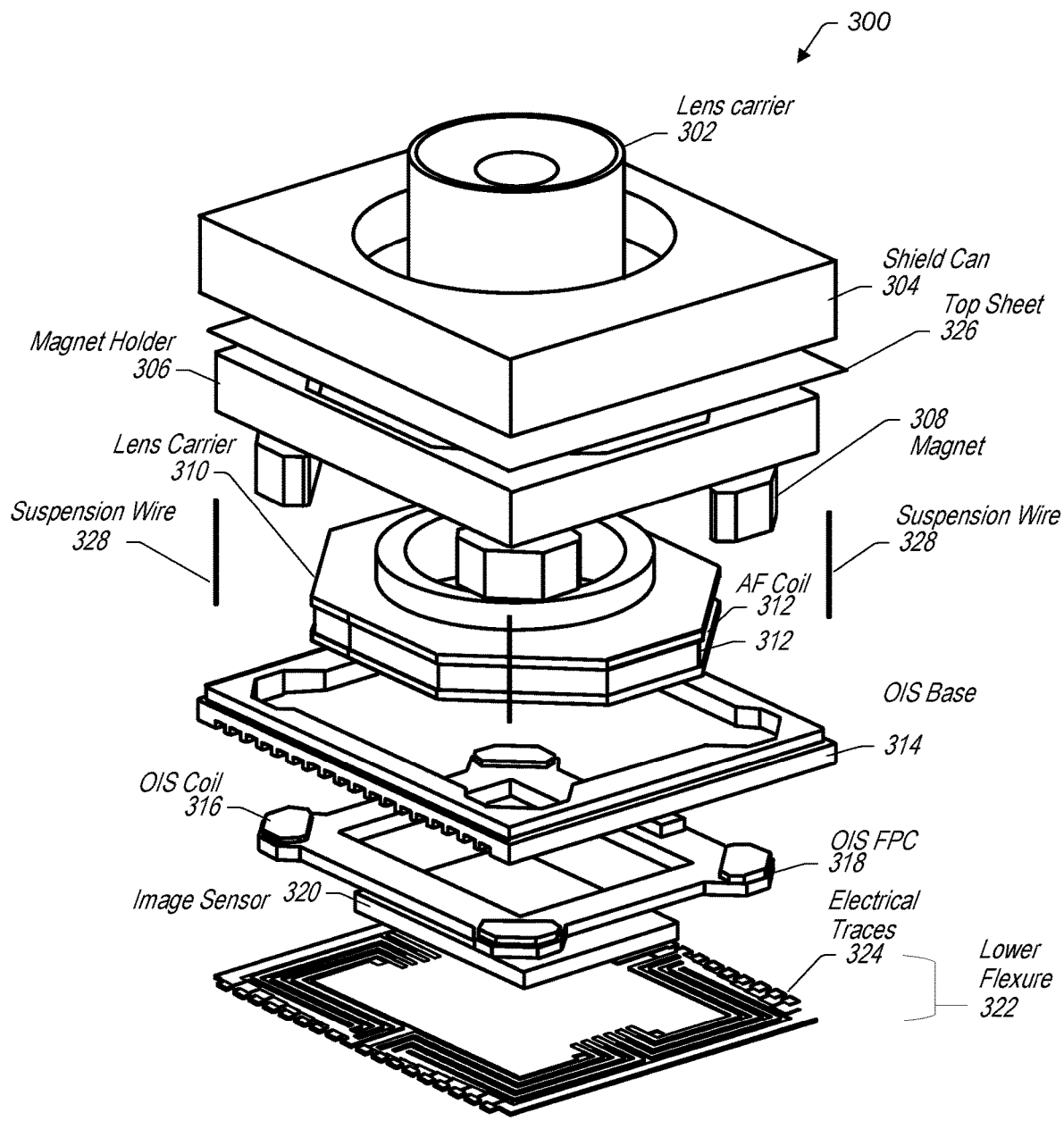
FIG. 3 illustrates an exploded perspective view of an example camera having a voice coil motor (VCM) actuator to move the lens carrier along an optical axis and one or more additional voice coil motor (VCM) actuators to move the image sensor along one or more axes perpendicular to the optical axis, in accordance with some embodiments. Furthermore.

FIG. 3 illustrates an exploded perspective view of an example camera 300 having a voice coil motor (VCM) actuator to move the image sensor along one or more axis, in accordance with some embodiments. Furthermore, FIG. 3 shows an example lower flexure of a flexure arrangement of the camera 300, in accordance with some embodiments. In some embodiments, the camera 300 may include one or multiple features, components, and/or functionality of embodiments described herein with reference to FIGS. 1, 2, and 4-8.

In various embodiments, the camera 300 may include one or more lenses 302, a shield can 304, a magnet holder 306, one or more magnets 308, a lens carrier 310, one or more AF coils 312, a base 314, one or more OIS coils 316, an OIS flexible printed circuit (FPC) 318 (e.g., similar in functionality to substrate 128 in FIG. 1), an image sensor 320, a lower flexure 322 (e.g., similar in functionality to the flexure arms 144 and lower flexure 136 of the flexure arrangement 108 of FIGS. 1 and 2), and/or electrical traces 324. FIG. 3 illustrates a particular arrangement of lower flexure 322 that performs functionality similar to that of the lower flexure 136 illustrated in FIG. 1. Additionally, FIG. 3 illustrates a top sheet 326, similar to top sheet 138 illustrated in FIGS. 1 and 2. Note that top sheet 326 is illustrated as a flat sheet in FIG. 3 for ease of illustration, but may include flex tabs, and other features of the top sheet 138 illustrated in FIGS. 1 and 2. Also, FIG. 3 illustrates suspension wires 328, which may be similar to suspension wires 142 illustrated in FIGS. 1 and 2. In some embodiments, OIS coils 316 image sensor 320 and OIS flexible printed circuit board 328 may be mounted to a bottom sheet, such as bottom sheet 140 (not illustrated in FIG. 3). In some embodiments, suspension wires 328 may connect at a top side of the suspension wires to top sheet 138 and at bottom side of the suspension wires to a bottom sheet connected to OIS FPC 318 and OIS coils 316. The suspension wires may suspend the OIS flexible printed circuit (FPC) 318, OIS coils 316, and image sensor 320 from the top sheet 326 via the suspension wires 328.

In some embodiments, the shield can 304 may be mechanically attached to the OIS base 314. The camera 300 may include an AF VCM actuator (e.g., AF VCM actuator 116 discussed above with reference to FIGS. 1 and 2) and/or an OIS VCM actuator (e.g., OIS VCM actuator 114 discussed above with reference to FIGS. 1 and 2).

In some embodiments, a portion of the lower flexure 322 may be connected to a bottom surface of the base 314. In some examples, the base 314 may define one or more recesses and/or openings having multiple different cross-sections. For instance, a lower portion of the base 314 may define a recess and/or an opening with a cross-section sized to receive the lower flexure 322. An upper portion of the base 314 may define a recess and/or an opening with a cross-section sized to receive the OIS FPC 318. The upper portion of the base 314 may have an inner profile corresponding to the outer profile of the OIS FPC 318. This may help to maximize the amount of material included in the base 314 (e.g., for providing structural rigidity to the base 314) while still providing at least a minimum spacing between the OIS FPC 318 and the base 314.

In some non-limiting examples, the OIS FPC 318 and the image sensor 320 may be separately attached to the lower flexure 322. For instance, a first set of one or more electrical traces may be routed between the OIS FPC 318 and the lower flexure 322. A second, different set of one or more electrical traces may be routed between the image sensor 320 and the lower flexure 322. In other embodiments, the image sensor 320 may be attached to or otherwise integrated into the OIS FPC 318, such that the image sensor 320 is connected to the lower flexure 322 via the OIS FPC 318.

Figure 4:
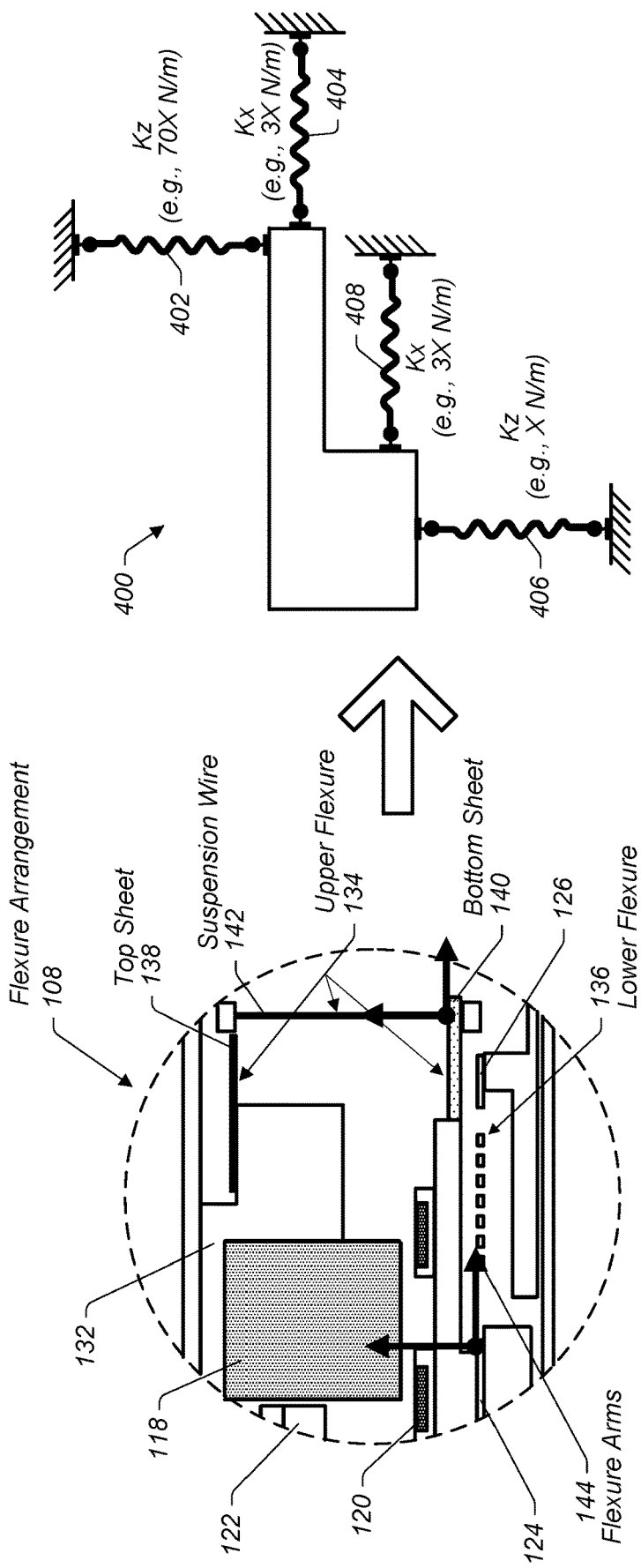
FIG. 4 is a schematic diagram illustrating a flexure arrangement as shown in FIG. 1 and an example modeling of the spring coefficients of the example flexure arrangement of FIG. 1, in accordance with some embodiments.
Figure 5:
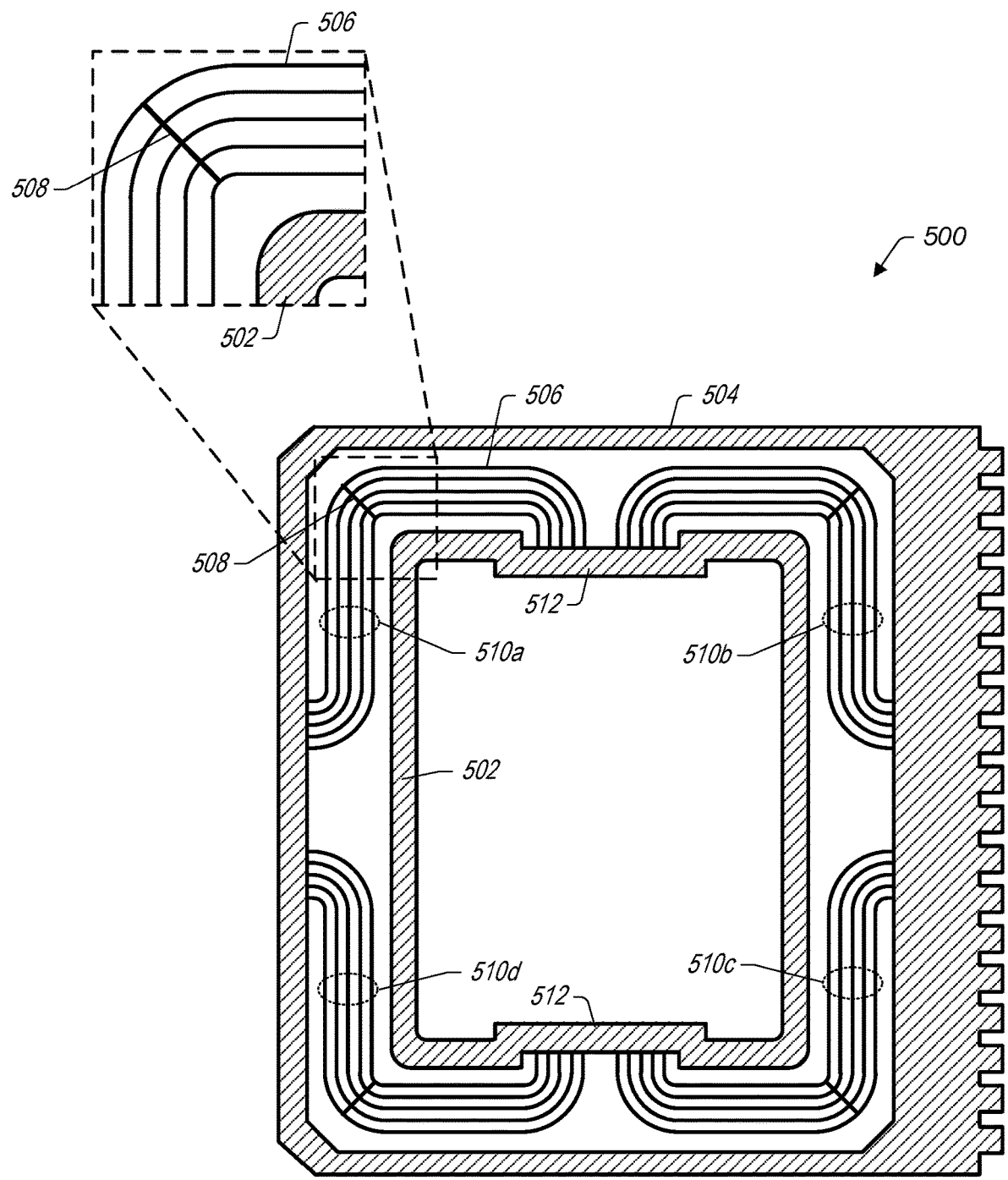
FIG. 5 illustrates a top view of an example lower flexure of a flexure arrangement that may be used in a camera having image sensor shifting capabilities, in accordance with some embodiments.

FIG. 4 is a schematic diagram illustrating example stiffness components 400 of the example flexure arrangement 108 of FIG. 1, in accordance with some embodiments. In some embodiments, the stiffness components 400 may include one or multiple features, components, and/or functionality of embodiments described herein with reference to FIGS. 1-3 and 5-8.

The particular configuration of the flexures described above in regard to FIGS. 1-3 facilitates movement for OIS in the X and Y directions, while maintaining relatively fixed positioning in the Z direction (e.g., providing a relatively fixed platform in the Z direction, such that the autofocus is relatively unaffected by the OIS mechanism and moveable platform 124, in embodiments). For instance, upper flexure 134 offloads the weight of the vertical suspension (the Z-direction) from the lower flexure 136, without adding significant X/Y stiffness to the moveable platform 124. In some examples, the upper flexure 134 may provide higher stiffness (e.g., an order of magnitude higher stiffness or more) in the Z-direction compared to its stiffness in the X and Y directions. For instance, the upper flexure 134 may have a stiffness component in the Z direction that is represented by spring stiffness 402. The upper flexure 134 may have a stiffness component in the X (and/or Y) direction that is represented by spring stiffness 404. The lower flexure 136 may have a stiffness component in the Z direction that is represented by spring stiffness 406. Furthermore, the lower flexure 136 may have a stiffness component in the X (and/or Y) direction that is represented by spring stiffness 408. Note that spring stiffness 402, 404, 406, and 408 are representative of spring coefficients of upper flexure 134 and lower flexure 136 in the X and Z directions and do not necessarily represent actual springs included in flexure arrangement 108.

In some non-limiting embodiments, the Z stiffness provided by the lower flexure 136 may be substantially lower than the X and/or Y stiffness provided by the lower flexure 136. In a non-limiting example, spring stiffness 406 may be X N/m, and spring stiffness 408 may be about 3X N/m. Additionally, or alternatively, the Z stiffness provided by the upper flexure 134 may be substantially higher than the X and/or Y stiffness provided by the upper flexure 136. In a non-limiting example, spring stiffness 402 may be about 70X N/m, and spring stiffness 404 may be about 3X N/m. In some embodiments, the high Z stiffness provided by the upper flexure 134 may allow for the lower flexure 136 to have a low aspect ratio, which may make the lower flexure easier to manufacture than some other flexures that have a higher aspect ratio. For example, a thickness of the lower flexure 136 may be reduced because the lower flexure 136 does not have to support the full weight of the moveable platform 124 because a significant portion of this weight is supported by the suspension wires 142 of the upper flexure arrangement 108. As a non-limiting example, the flexure arms 144 of the lower flexure 136 may have an aspect ratio of about 1.5 to 1.

FIG. 5 illustrates a top view of an example lower flexure 500 of a flexure arrangement that may be used in a camera having image sensor shifting capabilities, in accordance with some embodiments. In some embodiments, the lower flexure 500 may include one or multiple features, components, and/or functionality of embodiments described herein with reference to FIGS. 1-4 and 6-8. For example, a lower flexure 136 as illustrated in FIGS. 1-2 and a lower flexure 322 as illustrated in FIG. 3 may have a similar configuration as lower flexure 500 illustrated in FIG. 5.

In some embodiments, the lower flexure 500 may be part of a flexure arrangement used in a camera. For instance, the flexure arrangement may also include an upper flexure in some embodiments. The lower flexure 500 may include a moveable platform 502 and a stationary platform 504.

In various examples, the lower flexure 500 may include one or more flexure arms 506. The flexure arms 506 may be configured to mechanically connect the moveable platform 502 to the stationary platform 504. The flexure arms may be configured to provide stiffness (e.g., in-plane flexure stiffness) to the OIS VCM actuator while allowing the moveable platform 502 (and an image sensor fixed relative to the moveable platform 502) to move along a plane that is orthogonal to an optical axis defined by one or more lenses of the camera. In this manner, the image sensor may be shifted along the plane that is orthogonal to the optical axis to provide OIS movement. Furthermore, one or multiple flexure arms 506 may include electrical traces configured to convey signals (e.g., image signals generated by the image sensor fixed relative to the moveable platform 502) from the moveable platform 502 to the stationary platform 504.

In various embodiments, the lower flexure 500 may include one or more flexure stabilizer members 508. The flexure stabilizer members 508 may be configured to mechanically connect flexure arms 506 to each other such that the flexure stabilizer members 507 prevent interference between the flexure arms 506 that are connected by the flexure stabilizer members 508. For instance, the flexure stabilizer members 508 may be configured to prevent the flexure arms 506 from colliding and/or entangling with one another, e.g., in drop events, vibration events, etc. Additionally, or alternatively, the flexure stabilizer members 508 may be configured to limit motion of, and/or stabilize relative motion between, the flexure arms 506 that are connected by the flexure stabilizer members 508. Furthermore, the flexure stabilizer members 507 may be arranged along various portions of the flexure arms 506 to provide in-plane stiffness as needed in the lower flexure 500, e.g., to satisfy OIS design requirements.

In some embodiments, the flexure arms 506 may be arranged in one or more flexure arm groups 510, or arrays, that individually include multiple flexure arms 506. For instance, as depicted in FIG. 5, the lower flexure 500 may include a first flexure arm group 510a, a second flexure arm group 510b, a third flexure arm group 810c, and a fourth flexure arm group 510d. In some examples, the flexure arms 506 of a flexure arm group 510 may be parallel to each other along a plane that is orthogonal to the optical axis. In some cases, the flexure arms 506 of one flexure arm group 510 (e.g., the first flexure arm group 510a) may not be parallel to the flexure arms 506 of another flexure arm group (e.g., the second flexure arm group 510b). In some cases, one or more of the flexure arm group 510 may include one or more flexure stabilizer members 508. For instance, each of the flexure arm groups 510 may include one or more flexure stabilizer members 508. Furthermore, one or more of the flexure arm groups 510 may include one or more bend (or "turn") portions. In some cases, at least one of the flexure arm groups 510 may include a flexure stabilizer member 508 disposed at a bend portion. For example, in FIG. 5, each of the flexure arm groups 510 bend at three respective bend portions, and a respective flexure stabilizer member 508 connects the flexure arms 506 of respective flexure arm groups 510 at one respective bend portion of the three respective bend portions.

In some examples, the moveable platform 502 and/or the stationary platform 504 may include one or more offsets 512 (e.g., a recess, an extension, etc.). In some cases, one or more flexure arms 506 may connect to the moveable platform 502 and/or the stationary platform 504 at an offset 512. For instance, as illustrated in FIG. 5, the moveable platform 502 may include two recess offsets 512 at opposing sides of the moveable platform 502. However, in some embodiments, the moveable platform 502 and/or the stationary platform 504 may include a different offset configuration.

Figure 6:
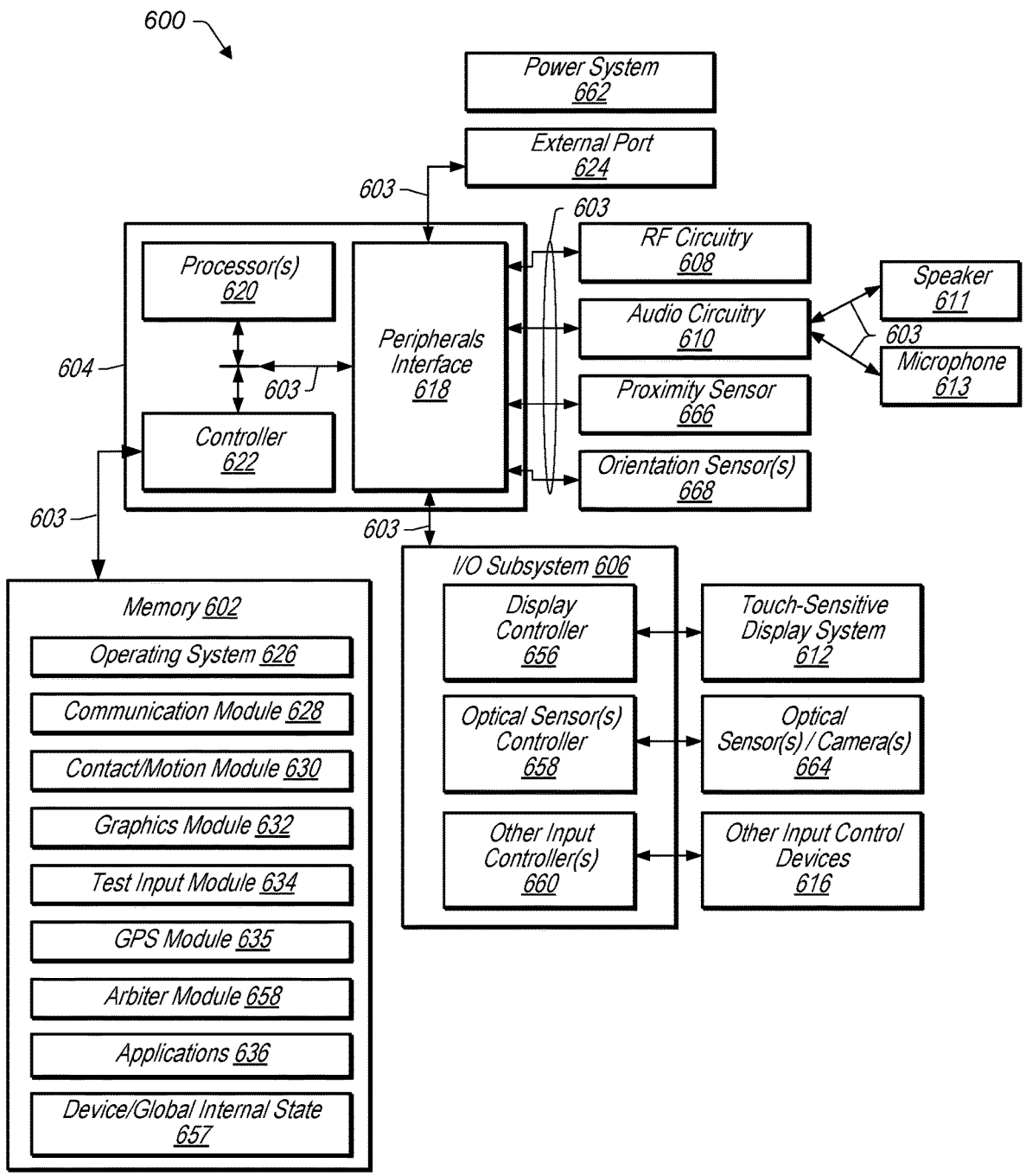
FIG. 6 illustrates a block diagram of an example portable multifunction device that may include a camera with image sensor shifting capabilities and/or that may include a flexure arrangement, in accordance with some embodiments.

FIG. 6 illustrates a block diagram of an example portable multifunction device 600 that may include a camera with image sensor shifting capabilities and/or that may include a flexure arrangement, in accordance with some embodiments. In some embodiments, the portable multifunction device 600 may include one or multiple features, components, and/or functionality of embodiments described herein with reference to FIGS. 1-5, 7, and 8.

Camera(s) 664 is sometimes called an "optical sensor" for convenience, and may also be known as or called an optical sensor system. Device 600 may include memory 602 (which may include one or more computer readable storage mediums), memory controller 622, one or more processing units (CPUs) 620, peripherals interface 618, RF circuitry 608, audio circuitry 610, speaker 611, touch-sensitive display system 612, microphone 613, input/output (I/O) subsystem 606, other input or control devices 616, and external port 624. Device 600 may include one or more optical sensors 664. These components may communicate over one or more communication buses or signal lines 603.

It should be appreciated that device 600 is only one example of a portable multifunction device, and that device 600 may have more or fewer components than shown, may combine two or more components, or may have a different configuration or arrangement of the components. The various components shown in FIG. 6 may be implemented in hardware, software, or a combination of hardware and software, including one or more signal processing and/or application specific integrated circuits.

Memory 602 may include high-speed random access memory and may also include non-volatile memory, such as one or more magnetic disk storage devices, flash memory devices, or other non-volatile solid-state memory devices. Access to memory 602 by other components of device 600, such as CPU 620 and the peripherals interface 618, may be controlled by memory controller 622.

Peripherals interface 618 can be used to couple input and output peripherals of the device to CPU 620 and memory 602. The one or more processors 620 run or execute various software programs and/or sets of instructions stored in memory 602 to perform various functions for device 600 and to process data.

In some embodiments, peripherals interface 618, CPU 620, and memory controller 622 may be implemented on a single chip, such as chip 604. In some other embodiments, they may be implemented on separate chips.

RF (radio frequency) circuitry 608 receives and sends RF signals, also called electromagnetic signals. RF circuitry 608 converts electrical signals to/from electromagnetic signals and communicates with communications networks and other communications devices via the electromagnetic signals. RF circuitry 608 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 608 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 610, speaker 611, and microphone 613 provide an audio interface between a user and device 600. Audio circuitry 610 receives audio data from peripherals interface 618, converts the audio data to an electrical signal, and transmits the electrical signal to speaker 611. Speaker 611 converts the electrical signal to human-audible sound waves. Audio circuitry 610 also receives electrical signals converted by microphone 613 from sound waves. Audio circuitry 610 converts the electrical signal to audio data and transmits the audio data to peripherals interface 618 for processing. Audio data may be retrieved from and/or transmitted to memory 602 and/or RF circuitry 608 by peripherals interface 618. In some embodiments, audio circuitry 610 also includes a headset jack (e.g., 712, FIG. 7). The headset jack provides an interface between audio circuitry 610 and removable audio input/output peripherals, such as output-only headphones or a headset with both output (e.g., a headphone for one or both ears) and input (e.g., a microphone).

I/O subsystem 606 couples input/output peripherals on device 600, such as touch screen 612 and other input control devices 616, to peripherals interface 618. I/O subsystem 606 may include display controller 656 and one or more input controllers 660 for other input or control devices. The one or more input controllers 660 receive/send electrical signals from/to other input or control devices 616. The other input control devices 616 may include physical buttons (e.g., push buttons, rocker buttons, etc.), dials, slider switches, joysticks, click wheels, and so forth. In some alternate embodiments, input controller(s) 660 may be coupled to any (or none) of the following: a keyboard, infrared port, USB port, and a pointer device such as a mouse. The one or more buttons (e.g., 708, FIG. 7) may include an up/down button for volume control of speaker 611 and/or microphone 613. The one or more buttons may include a push button (e.g., 706, FIG. 7).

Touch-sensitive display 612 provides an input interface and an output interface between the device and a user. Display controller 656 receives and/or sends electrical signals from/to touch screen 612. Touch screen 612 displays visual output to the user. The visual output may include graphics, text, icons, video, and any combination thereof (collectively termed "graphics"). In some embodiments, some or all of the visual output may correspond to user-interface objects.

Touch screen 612 has a touch-sensitive surface, sensor or set of sensors that accepts input from the user based on haptic and/or tactile contact. Touch screen 612 and display controller 656 (along with any associated modules and/or sets of instructions in memory 602) detect contact (and any movement or breaking of the contact) on touch screen 612 and converts the detected contact into interaction with user-interface objects (e.g., one or more soft keys, icons, web pages or images) that are displayed on touch screen 612. In an example embodiment, a point of contact between touch screen 612 and the user corresponds to a finger of the user.

Touch screen 612 may use LCD (liquid crystal display) technology, LPD (light emitting polymer display) technology, or LED (light emitting diode) technology, although other display technologies may be used in other embodiments. Touch screen 612 and display controller 656 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 612. In an example embodiment, projected mutual capacitance sensing technology is used.

Touch screen 612 may have a video resolution in excess of 100 dpi. In some embodiments, the touch screen has a video resolution of approximately 160 dpi. The user may make contact with touch screen 612 using any suitable object or appendage, such as a stylus, a finger, and so forth.

In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 600 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 612 or an extension of the touch-sensitive surface formed by the touch screen.

Device 600 also includes power system 662 for powering the various components. Power system 662 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 600 may also include one or more optical sensors or cameras 664. FIG. 6 shows an optical sensor 664 coupled to optical sensor controller 658 in I/O subsystem 606. Optical sensor 664 may include charge-coupled device (CCD) or complementary metal-oxide semiconductor (CMOS) phototransistors. Optical sensor 664 receives light from the environment, projected through one or more lens, and converts the light to data representing an image. In conjunction with imaging module 643 (also called a camera module), optical sensor 664 may capture still images or video. In some embodiments, an optical sensor 664 is located on the back of device 600, opposite touch screen display 612 on the front of the device, so that the touch screen display 612 may be used as a viewfinder for still and/or video image acquisition. In some embodiments, another optical sensor is located on the front of the device so that the user's image may be obtained for videoconferencing while the user views the other video conference participants on the touch screen display.

Device 600 may also include one or more proximity sensors 666. FIG. 6 shows proximity sensor 666 coupled to peripherals interface 618. Alternately, proximity sensor 666 may be coupled to input controller 660 in I/O subsystem 606. In some embodiments, the proximity sensor 666 turns off and disables touch screen 612 when the multifunction device 600 is placed near the user's ear (e.g., when the user is making a phone call).

Device 600 includes one or more orientation sensors 668. In some embodiments, the one or more orientation sensors 668 include one or more accelerometers (e.g., one or more linear accelerometers and/or one or more rotational accelerometers). In some embodiments, the one or more orientation sensors 668 include one or more gyroscopes. In some embodiments, the one or more orientation sensors 668 include one or more magnetometers. In some embodiments, the one or more orientation sensors 668 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 600. In some embodiments, the one or more orientation sensors 668 include any combination of orientation/rotation sensors. FIG. 6 shows the one or more orientation sensors 668 coupled to peripherals interface 618. Alternately, the one or more orientation sensors 668 may be coupled to an input controller 660 in I/O subsystem 606. In some embodiments, information is displayed on the touch screen display 612 in a portrait view or a landscape view based on an analysis of data received from the one or more orientation sensors 668.

In some embodiments, the software components stored in memory 602 include operating system 626, communication module (or set of instructions) 628, contact/motion module (or set of instructions) 630, graphics module (or set of instructions) 632, text input module (or set of instructions) 634, Global Positioning System (GPS) module (or set of instructions) 635, arbiter module 658 and applications (or sets of instructions) 636. Furthermore, in some embodiments memory 602 stores device/global internal state 657. Device/global internal state 657 includes one or more of: active application state, indicating which applications, if any, are currently active; display state, indicating what applications, views or other information occupy various regions of touch screen display 612; sensor state, including information obtained from the device's various sensors and input control devices 616; and location information concerning the device's location and/or attitude.

Operating system 626 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 628 facilitates communication with other devices over one or more external ports 624 and also includes various software components for handling data received by RF circuitry 608 and/or external port 624. External port 624 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 630 may detect contact with touch screen 612 (in conjunction with display controller 656) and other touch sensitive devices (e.g., a touchpad or physical click wheel). In some embodiments, contact/motion module 630 and display controller 656 detect contact on a touchpad. Contact/motion module 630 may detect a gesture input by a user. Different gestures on the touch-sensitive surface have different contact patterns. Graphics module 632 includes various known software components for rendering and displaying graphics on touch screen 612 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like. Text input module 634, which may be a component of graphics module 632, provides soft keyboards for entering text in various applications (e.g., contacts, e-mail, and any other application that needs text input). GPS module 635 determines the location of the device and provides this information for use in various applications 636 (e.g., to a camera application as picture/video metadata).

Applications 636 may include one or more modules (e.g., a contacts module, an email client module, a camera module for still and/or video images, etc.) Examples of other applications 636 that may be stored in memory 602 include other word processing applications, other image editing applications, drawing applications, presentation applications, JAVA-enabled applications, encryption, digital rights management, voice recognition, and voice replication. Each of the modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 602 may store a subset of the modules and data structures identified above. Furthermore, memory 602 may store additional modules and data structures not described above.

Figure 7:
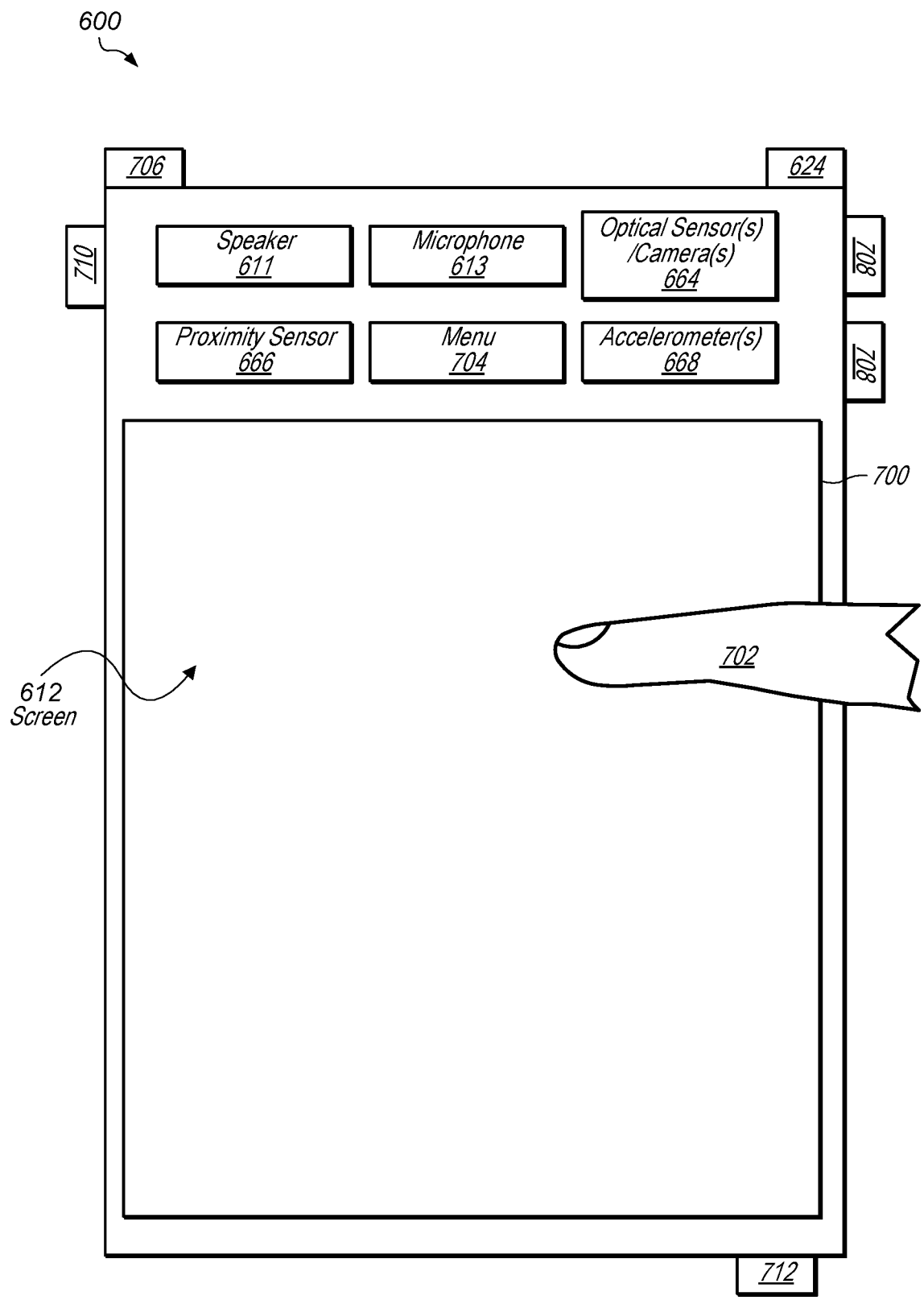
FIG. 7 depicts an example portable multifunction device that may include a camera with image sensor shifting capabilities and/or that may include a flexure arrangement, in accordance with some embodiments.

FIG. 7 depicts an example portable multifunction device 600 that may include a camera with image sensor shifting capabilities and/or that may include a flexure arrangement, in accordance with some embodiments. In some embodiments, the portable multifunction device 600 may include one or multiple features, components, and/or functionality of embodiments described herein with reference to FIGS. 1-6 and 8.

The device 600 may have a touch screen 612. The touch screen 612 may display one or more graphics within user interface (UI) 700. In this embodiment, as well as others described below, a user may select one or more of the graphics by making a gesture on the graphics, for example, with one or more fingers 702 (not drawn to scale in the figure) or one or more styluses 703 (not drawn to scale in the figure).

Device 600 may also include one or more physical buttons, such as "home" or menu button 704. As described previously, menu button 704 may be used to navigate to any application 636 in a set of applications that may be executed on device 600. Alternatively, in some embodiments, the menu button 704 is implemented as a soft key in a GUI displayed on touch screen 612.

In one embodiment, device 600 includes touch screen 612, menu button 704, push button 706 for powering the device on/off and locking the device, volume adjustment button(s) 708, Subscriber Identity Module (SIM) card slot 710, head set jack 712, and docking/charging external port 624. Push button 706 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 600 also may accept verbal input for activation or deactivation of some functions through microphone 613.

It should be noted that, although many of the examples herein are given with reference to optical sensor(s)/camera(s) 664 (on the front of a device), one or more rear-facing cameras or optical sensors that are pointed opposite from the display may be used instead of, or in addition to, an optical sensor(s)/camera(s) 664 on the front of a device.

Figure 8:
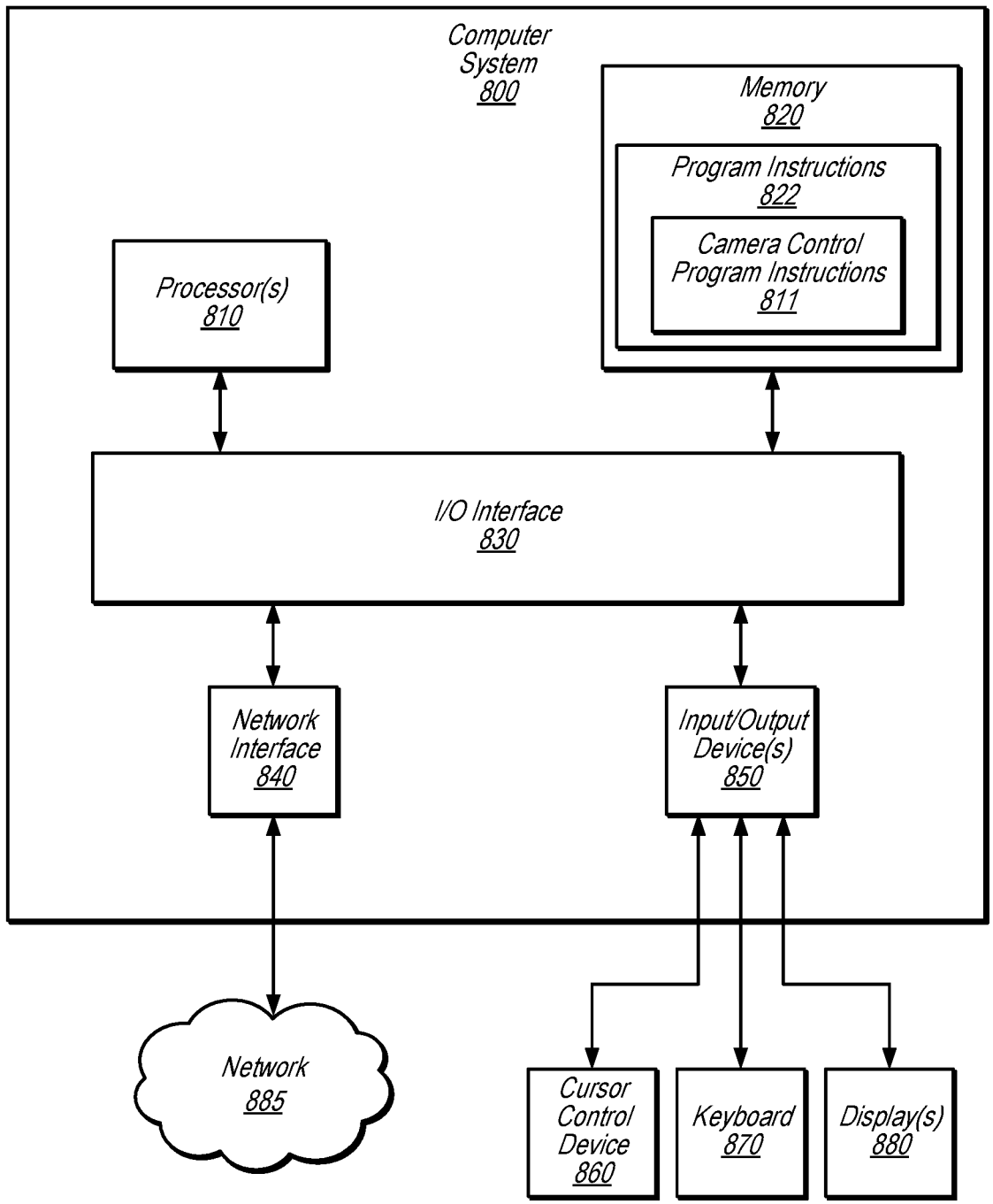
FIG. 8 illustrates an example computer system that may include a camera with image sensor shifting capabilities and/or that may include a flexure arrangement, in accordance with some embodiments.

FIG. 8 illustrates an example computer system 800 that may include a camera with image sensor shifting capabilities and/or that may include a flexure arrangement, in accordance with some embodiments. In some embodiments, the computer system 800 may include one or multiple features, components, and/or functionality of embodiments described herein with reference to FIGS. 1-7.

The computer system 800 may be configured to execute any or all of the embodiments described above. In different embodiments, computer system 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of magnetic position sensing, as described herein may be executed in one or more computer systems 800, which may interact with various other devices. Note that any component, action, or functionality described above with respect to FIGS. 1-7 may be implemented on one or more computers configured as computer system 800 of FIG. 8, according to various embodiments. In the illustrated embodiment, computer system 800 includes one or more processors 810 coupled to a system memory 820 via an input/output (I/O) interface 830. Computer system 800 further includes a network interface 840 coupled to I/O interface 830, and one or more input/output devices 850, such as cursor control device 860, keyboard 870, and display(s) 880. In some cases, it is contemplated that embodiments may be implemented using a single instance of computer system 800, while in other embodiments multiple such systems, or multiple nodes making up computer system 800, may be configured to host different portions or instances of embodiments. For example, in one embodiment some elements may be implemented via one or more nodes of computer system 800 that are distinct from those nodes implementing other elements.

In various embodiments, computer system 800 may be a uniprocessor system including one processor 810, or a multiprocessor system including several processors 810 (e.g., two, four, eight, or another suitable number). Processors 810 may be any suitable processor capable of executing instructions. For example, in various embodiments processors 810 may be general-purpose or embedded processors implementing any of a variety of instruction set architectures (ISAs), such as the x86, PowerPC, SPARC, or MIPS ISAs, or any other suitable ISA. In multiprocessor systems, each of processors 810 may commonly, but not necessarily, implement the same ISA.

System memory 820 may be configured to store camera control program instructions 822 and/or camera control data accessible by processor 810. In various embodiments, system memory 820 may be implemented using any suitable memory technology, such as static random access memory (SRAM), synchronous dynamic RAM (SDRAM), nonvolatile/Flash-type memory, or any other type of memory. In the illustrated embodiment, program instructions 822 may be configured to implement a lens control application 824 incorporating any of the functionality described above. Additionally, existing camera control data 832 of memory 820 may include any of the information or data structures described above. In some embodiments, program instructions and/or data may be received, sent or stored upon different types of computer-accessible media or on similar media separate from system memory 820 or computer system 800. While computer system 800 is described as implementing the functionality of functional blocks of previous Figures, any of the functionality described herein may be implemented via such a computer system.

In one embodiment, I/O interface 830 may be configured to coordinate I/O traffic between processor 810, system memory 820, and any peripheral devices in the device, including network interface 840 or other peripheral interfaces, such as input/output devices 850. In some embodiments, I/O interface 830 may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computer system 800 and other devices attached to a network 885 (e.g., carrier or agent devices) or between nodes of computer system 800. Network 885 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 840 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 850 may, in some embodiments, include one or more display terminals, keyboards, keypads, touchpads, scanning devices, voice or optical recognition devices, or any other devices suitable for entering or accessing data by one or more computer systems 800. Multiple input/output devices 850 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 840.

As shown in FIG. 8, memory 820 may include program instructions 822, which may be processor-executable to implement any element or action described above. In one embodiment, the program instructions may implement the methods described above. In other embodiments, different elements and data may be included. Note that data may include any data or information described above.

Those skilled in the art will appreciate that computer system 800 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera, comprising:
one or more lens elements that define an optical axis;
an image sensor configured to capture light that has passed through the one or more lens elements;
a moveable platform fixedly coupled to the image sensor such that the image sensor moves together with the moveable platform;
an actuator module configured to move the image sensor in one or more directions orthogonal to the optical axis; and
a flexure arrangement configured to guide the movement of the moveable platform in a controlled manner, the flexure arrangement comprising:
an upper flexure that couples one or more fixed components of the camera to the moveable platform; and
a lower flexure that connects the moveable platform to one or more fixed components of the camera;
wherein the upper flexure supports the moveable platform with a greater stiffness in a direction parallel to the optical axis than the lower flexure.

2. The camera of claim 1, wherein the upper flexure comprises:
a top sheet, attached to one or more fixed components of the camera, that defines a first plane that is parallel to the image sensor;
a bottom sheet that defines a second plane that is parallel to the first plane and is fixedly coupled to the moveable platform; and
one or more suspension wires.

3. The camera of claim 2, wherein the one or more suspension wires each comprise:
a top end portion attached to the top sheet; and
a bottom end portion coupled to the moveable platform.

4. The camera of claim 3, wherein the one or more suspension wires of the upper flexure extend from the top sheet to the bottom sheet in a direction that is orthogonal to a length of the image sensor.

5. The camera of claim 1, wherein the actuator module comprises a voice coil motor (VCM) actuator assembly.

6. The camera of claim 5, wherein:
the VCM actuator assembly comprises an optical image stabilization (OIS) VCM actuator to move the image sensor in directions orthogonal to the optical axis;
the OIS VCM actuator comprises:
a magnet attached to a magnet holder; and
an OIS coil coupled to the moveable platform; and
the upper flexure comprises a top sheet that is attached to the magnet holder.

7. The camera of claim 6, wherein:
the VCM actuator assembly further comprises an autofocus (AF) VCM actuator to move the one or more lens elements along the optical axis; and
the AF VCM actuator comprises:
the magnet attached to the magnet holder; and
an AF coil coupled to a lens carrier that holds the one or more lens elements.

8. A device, comprising:
a camera, comprising:
one or more lens elements that define an optical axis;
an image sensor configured to capture light that has passed through the one or more lens elements; and
a voice coil motor (VCM) actuator to move the image sensor, relative to the one or more lens elements, in one or more directions orthogonal to the optical axis, the VCM actuator comprising:
a moveable platform coupled to the image sensor such that the image sensor moves together with the moveable platform;
a stationary platform configured to be stationary relative to the moveable platform; and a flexure arrangement to guide motion of the moveable platform in a controlled manner, the flexure arrangement comprising:
an upper flexure, comprising a suspension wire coupled to the moveable platform; and
a lower flexure comprising one or more flexure arms that connect the moveable platform to the stationary platform.

9. The device of claim 8, wherein:
the upper flexure further comprises:
a top sheet; and
a bottom sheet coupled to the moveable platform; and
the suspension wire extends, in a direction parallel to the optical axis, from the top sheet to the bottom sheet.

10. The device of claim 9, wherein the suspension wire comprises:
a top end portion attached to a corner portion of the top sheet; and
a bottom end portion attached to a corresponding corner portion of the bottom sheet that is proximate the corner portion of the top sheet.

11. The device of claim 8, wherein the suspension wire has a greater stiffness in a direction aligned with the optical axis than in directions orthogonal to the optical axis.

12. The device of claim 8, further comprising:
a display; and
one or more processors to:
cause the camera to capture an image via the image sensor; and
cause the display to present the image.

13. The device of claim 12, wherein the one or more processors are further configured to cause the VCM actuator to move the image sensor in one or more directions orthogonal to the optical axis.

14. A voice coil motor (VCM) actuator assembly for a camera, the VCM actuator assembly comprising:
one or more magnets;
one or more coils;
a moveable platform configured to be coupled to an image sensor of the camera, such that the image sensor moves together with the moveable platform;
a stationary platform configured to be stationary relative to the moveable platform; and
a flexure arrangement to guide motion of the moveable platform in a controlled manner, the flexure arrangement comprising:
an upper flexure, comprising:
a top sheet;
a bottom sheet coupled to the moveable platform; and
a suspension wire extending from the top sheet to the bottom sheet; and
a lower flexure comprising one or more flexure arms that connect the moveable platform to the stationary platform.

15. The VCM actuator assembly of claim 14, wherein the suspension wire comprises:
a top end portion attached to the top sheet; and
a bottom end portion attached to the bottom sheet.

16. The VCM actuator assembly of claim 14, wherein:
the top sheet defines a first plane that is parallel to the image sensor; and
the bottom sheet defines a second plane that is parallel to the first plane.

17. The VCM actuator assembly of claim 14, wherein the wire extends from the top sheet to the bottom sheet in a direction that is orthogonal to the image sensor.

18. The VCM actuator assembly of claim 14, wherein:
the VCM actuator assembly comprises an optical image stabilization (OIS) VCM actuator configured to move the image sensor in directions orthogonal to the optical axis;
the OIS VCM actuator comprises:
a magnet attached to a magnet holder; and
an OIS coil coupled to the moveable platform; and
the top sheet is attached to the magnet holder.

19. The VCM actuator assembly of claim 18, wherein:
the VCM actuator assembly further comprises an autofocus (AF) VCM actuator configured to move a lens of the camera along the optical axis; and
the AF VCM actuator comprises:
the magnet attached to the magnet holder; and
an AF coil coupled to a lens carrier that holds the lens.

20. The VCM actuator assembly of claim 19, wherein:
the top sheet comprises:
a first portion that is attached to the magnet holder; and
a second portion that is attached to the lens carrier; and
the second portion of the top sheet suspends the lens carrier from the magnet holder.

\* \* \* \* \*